(12) United States Patent
Wuerstlein et al.

(10) Patent No.: US 9,385,709 B2
(45) Date of Patent: Jul. 5, 2016

(54) CAPACITIVE DISTANCE SENSOR

(71) Applicant: Brose Fahrzeugteile GmbH & Co. Kommanditgesellschaft, Hallstadt, Hallstadt (DE)

(72) Inventors: Holger Wuerstlein, Zeil am Main (DE); Thorsten Kuhnen, Litzendorf (DE)

(73) Assignee: Brose Fahrzeugteile GmbH & Co. KG Hallstadt, Hallstadt (DE)

( * ) Notice: Subject to any disclaimer, the term of this patent is extended or adjusted under 35 U.S.C. 154(b) by 465 days.

(21) Appl. No.: 13/772,875

(22) Filed: Feb. 21, 2013

(65) Prior Publication Data

US 2013/0162271 A1    Jun. 27, 2013

Related U.S. Application Data

(63) Continuation of application No. PCT/EP2011/004087, filed on Aug. 15, 2011.

(30) Foreign Application Priority Data

Aug. 21, 2010  (DE) ..................... 20 2010 011 656 U

(51) Int. Cl.
*G01B 7/14* (2006.01)
*H03K 17/955* (2006.01)
*G01D 5/24* (2006.01)

(52) U.S. Cl.
CPC ............... *H03K 17/955* (2013.01); *G01B 7/14* (2013.01); *G01D 5/2405* (2013.01)

(58) Field of Classification Search
CPC ....... G01B 7/14; H03K 17/955; G01D 5/2405
USPC ........................... 324/671, 658, 662
See application file for complete search history.

(56) References Cited

U.S. PATENT DOCUMENTS

| 4,041,771 | A | * | 8/1977 | Allan | F17C 13/12 324/519 |
|---|---|---|---|---|---|
| 4,791,431 | A | * | 12/1988 | LaPointe | 343/906 |
| 5,166,679 | A | | 11/1992 | Vranish et al. | |
| 5,298,682 | A | * | 3/1994 | Salz | 174/105 R |
| 5,359,491 | A | * | 10/1994 | Coville | G01B 7/14 29/592.1 |
| 6,583,360 | B1 | * | 6/2003 | Yudashkin | 174/105 R |
| 6,967,584 | B2 | | 11/2005 | Maki | |
| 2001/0045733 | A1 | * | 11/2001 | Stanley | B60N 2/002 280/735 |
| 2005/0092097 | A1 | | 5/2005 | Shank et al. | |
| 2007/0057665 | A1 | * | 3/2007 | Borst | G01D 11/245 324/207.2 |
| 2007/0164756 | A1 | * | 7/2007 | Lee | H03K 17/962 324/662 |

(Continued)

FOREIGN PATENT DOCUMENTS

| DE | 10 2004 036 322 A1 | 3/2005 |
|---|---|---|
| DE | 20 2006 009 189 U1 | 10/2007 |
| DE | 10 2008 031 307 A1 | 1/2010 |

(Continued)

*Primary Examiner* — Arleen M Vazquez
*Assistant Examiner* — Robert P Alejnikov, Jr.
(74) *Attorney, Agent, or Firm* — Muncy, Geissler, Olds & Lowe, P.C.

(57) ABSTRACT

A capacitive distance sensor is provided having an elongated sensor element. The sensor element comprises a cylindrical carrier body, which is made of an electrically non-conductive material and has a round cross-sectional areas, and a sensor area which substantially surrounds the carrier body in the manner of a sheath and is made of an electrically conductive material.

18 Claims, 3 Drawing Sheets

(56) References Cited

U.S. PATENT DOCUMENTS

2009/0295410 A1* 12/2009 Sakamaki ............... E05F 15/46
    324/658
2010/0182231 A1* 7/2010 Morimiya ............... G06F 3/044
    345/156

FOREIGN PATENT DOCUMENTS

| | | |
|---|---|---|
| GB | 645732 | 11/1950 |
| JP | 2008-130366 A | 6/2008 |
| JP | 2008130366 A * | 6/2008 |
| WO | WO 96/18067 A1 | 6/1996 |

\* cited by examiner

CAPACITIVE DISTANCE SENSOR

This nonprovisional application is a continuation of International Application No. PCT/EP2011/004087, which was filed on Aug. 15, 2011, and which claims priority to German Patent Application No. DE 20 2010 011 656.2, which was filed in Germany on Aug. 21, 2010, and which are both herein incorporated by reference.

BACKGROUND OF THE INVENTION

1. Field of the Invention

The invention relates to a capacitive distance sensor having an elongated sensor element, especially for application in the automobile industry.

2. Description of the Background Art

Capacitive distance sensors are used for detecting an object approaching a vehicle or vehicle part, for example as part of a parking aid or as part of a contactless clamping protection for electrically adjustable windows or doors. A further field of application for such capacitive distance sensors is in space travel or in the use in industrial plants in order to be able to determine the presence of persons and/or objects and optionally the (quantitative) distance of these persons or objects from the sensor in a contactless manner.

A capacitive distance sensor having a sensor element enclosing a sensor area and mounted on an element to be protected is known from US005166679A. The sensor area is essentially a planar, extended, thin and electrically conductive area and forms one electrode of a capacitor. An object penetrating into the area to be monitored by the sensor serves as the counterelectrode of the capacitor. In the case of an approach of the object to the sensor element, the capacitance of the capacitor formed between the sensor area and the counterelectrode changes. The change in capacitance is measured directly and/or indirectly by means of electronics and from this the distance of the object from the sensor element is determined.

It is disadvantageous in this sensor arrangement that a relatively large area of the element to be protected is covered by the sensor area.

In DE 10 2008 031 307 A1, a further capacitive distance sensor is disclosed, the sensor element of which comprises a coaxial cable. The core of the coaxial cable is used as sensor area with the aid of which the approach of an object to the sensor element is monitored. The outer conductor of the coaxial cable is used as shielding and is removed at certain locations so that only a predefined spatial area is monitored by the sensor element.

In this embodiment, the comparatively small sensor area is disadvantageous, which leads to a low capacitance of the sensor element and thus necessitates electronics which are elaborate and therefore susceptible to faults.

Further elongated sensor elements which, in addition to the acquisition of a contact of the sensor element by means of a capacitive sensor area, monitor the approach of an object to the sensor element capacitively are known from JP 2008 130366 A and US 2005/0092097 A1.

SUMMARY OF THE INVENTION

It is therefore an object of the invention to specify a capacitive distance sensor having an elongated sensor element which can be produced inexpensively and at the same time has a comparatively large sensor area for achieving a large capacitance.

According to an embodiment of the invention, the capacitive distance sensor contains an elongated sensor element which comprises a carrier body and a sensor area applied thereto. The carrier body has an electrically non-conductive material and has a cylindrical shape with a round cross sectional area. The radius of the cross sectional area is preferably between 0.5 mm and 10 mm. The sensor area surrounding the cylindrical sheath area has an electrically conductive material and has preferably a constant thickness.

The sensor element constructed in this manner has a large sensor area with a small outside dimension at the same time. The sensor element can also be produced in a material-saving and cost-effective manner. The elongated sensor element is advantageously designed to be flexible so that it can be attached to objects of the most varied geometries.

In an embodiment of the invention, the sensor area is manufactured of aluminum or copper. These materials have a comparatively high electrical conductivity with a comparatively low weight and are easily worked and are widely used in industrial manufacturing. The carrier body can be made of polyethylene.

The sensor area is suitably surrounded by an electrically non-conductive insulating layer in order to avoid faulty measurement values. This insulating layer is also used for protecting the sensor area against mechanical or chemical damage due to various environmental influences.

The sensor area can be formed by a foil within the context of the invention. In a particularly suitable embodiment, however, the sensor area can be formed of a wire mesh which, in particular, has the advantage of high wear-resistance and a great spatial adaptability.

In a suitable variant of the invention, the carrier body is made of solid material. In an alternative embodiment, the carrier body has the shape of a hollow cylinder and thus has an opening centrally which extends perpendicularly to the cross sectional area over the entire length of the cylindrical shape. The opening can be empty for reasons of saving material and/or weight. However this opening is suitably filled with a core. The sensor element thus has the structure of a conventional coaxial cable and, as a result, can be produced on conventional machines which produce coaxial cables. In a preferred variant, the core is made of an electrically non-conductive material which allows the sensor element to be inexpensively produced. In principle, however, the core can also be made of an electrically conductive material, especially of copper, within the context of the invention, especially since the interior of the sensor element is shielded by the surrounding sensor area, in any case. In this case, the core can be optionally short circuited to the sensor area in an electrically conductive manner, especially at the respective ends of the elongated sensor element.

At least one longitudinal end of the sensor element is hermetically sealed against the environment by a termination tightly joined to the insulating layer so that the sensor layer is also protected against water and dirt at the longitudinal end. The termination is preferably a macromelt and is sprayed or molded against the sensor element. As an alternative, the terminations can be plugged onto the end of the sensor element and welded or bonded tightly to the insulating layer. In at least one of the terminations, a contact point is preferably embedded at which the sensor area is in contact with an electrical connecting line.

The object of the invention is also achieved by a sensor element for a capacitive distance sensor having the abovementioned features and by the use of a sensor element having the abovementioned features in a capacitive distance sensor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Parts corresponding to one another are provided with the same reference symbols in all figures.

Figure 1:
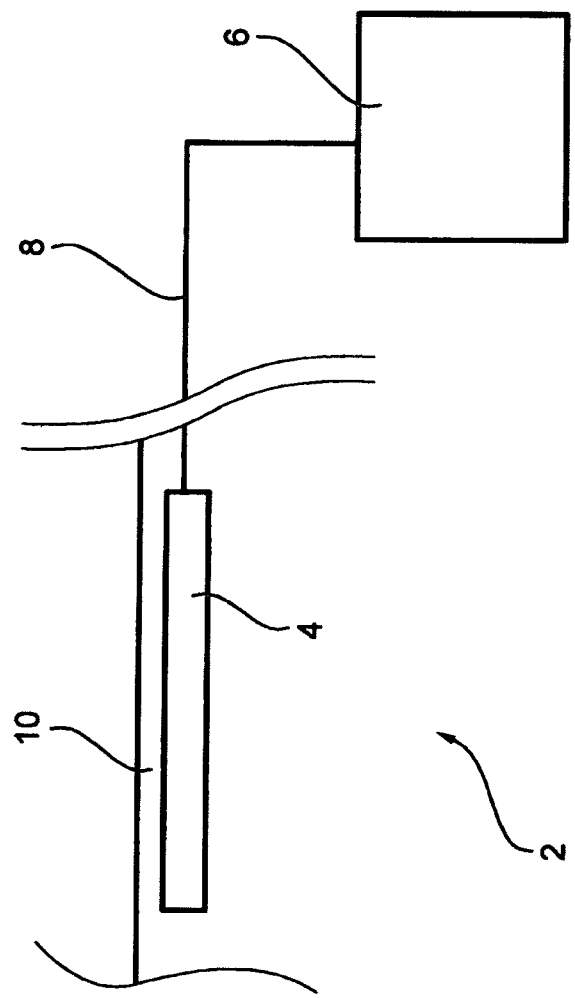
FIG. 1 diagrammatically shows a capacitive distance sensor having an elongated sensor element.

FIG. 1 shows diagrammatically a capacitive distance sensor 2. The distance sensor 2 comprises an elongated, flexible sensor element 4, electronics 6 and a connecting line 8 connecting the sensor element 4 electrically to the electronics 6. For example, the distance sensor 2 is located within a motor vehicle and is used as part of a keyless starting automatics system (Keyless-Go) for monitoring an approach of a person to the parked motor vehicle. In the case of an appropriate application, the sensor element 4 is mounted in the tail area of the motor vehicle, for example on the rear bumper 10. To cover the greatest possible monitoring range, the sensor element 4 suitably extends over the entire width of the motor vehicle.

The electronics 6 supply the sensor element 4 with current and evaluate the measurement data of the sensor element 4. In particular, the tail gate of the motor vehicle can be opened due to a signal emitted by the distance sensor 2 so that the approaching person does not have to perform any manual activity for opening the gate, that is to say does not have to open the gate by hand.

Figure 2:
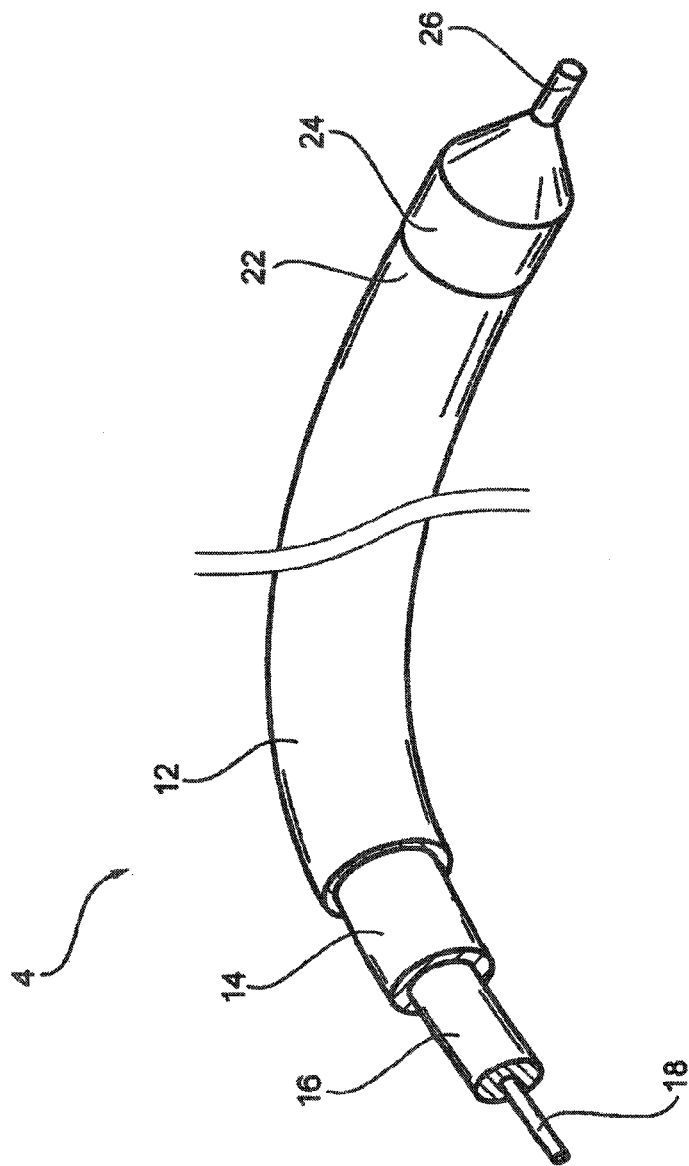
FIG. 2 shows the sensor element according to FIG. 1 perspectively in a section.
Figure 3:
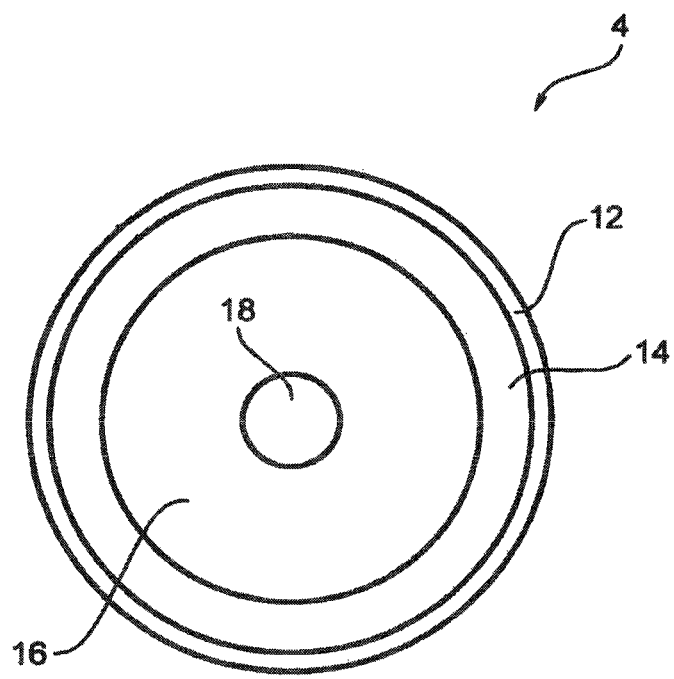
FIG. 3 shows the sensor element according to FIG. 1 in cross section.

The sensor element 4 is shown in greater detail in FIGS. 2 and 3. As can be seen from the representation, the sensor element 4 is cylindrical and has an onion peel structure which is formed from a number of coaxial tubular layers, namely an insulating layer 12, a sensor area 14 and a carrier body 16. A core 18 is located centrally in the interior of the sensor element 4. The outside diameter of the entire sensor element 4 can be between 2 mm and 30 mm. In the exemplary dimensioning, the outside diameter is about 7 mm.

The core 18 preferably has a non-conductive plastic, especially polyethylene. As an alternative, the core 18 can also be made of copper. The core 18 is surrounded in the manner of a sheath by an electrically non-conductive carrier body 16 which includes, for example, of polyethylene.

The sheath area of the carrier body 16 is joined by a sensor area 14. This layer includes copper, optionally also of aluminum, is formed by a wire mesh. However, it would also be conceivable to produce the sensor area 14 from a metal foil instead of the mesh. The sensor area 14 is surrounded by an insulating layer 12 to avoid a short circuit and for protecting the sensor area 14 against environmental influences such as, for example, corrosion or mechanical damage.

At one end 22 of the sensor element 4, a termination 24 is located. The body of the termination 24 is formed of macromelt and is molded to the sensor element 4. In the termination 24, a connecting point 26 is embedded at which the sensor area 14 is brought into contact with the connecting line 8.

From the basic layer structure, the sensor element 4 shown in FIG. 2 and FIG. 3 corresponds approximately to a conventional coaxial cable. This makes it possible to produce the sensor element 4 on a conventional machine for producing coaxial cables.

Figure 4:
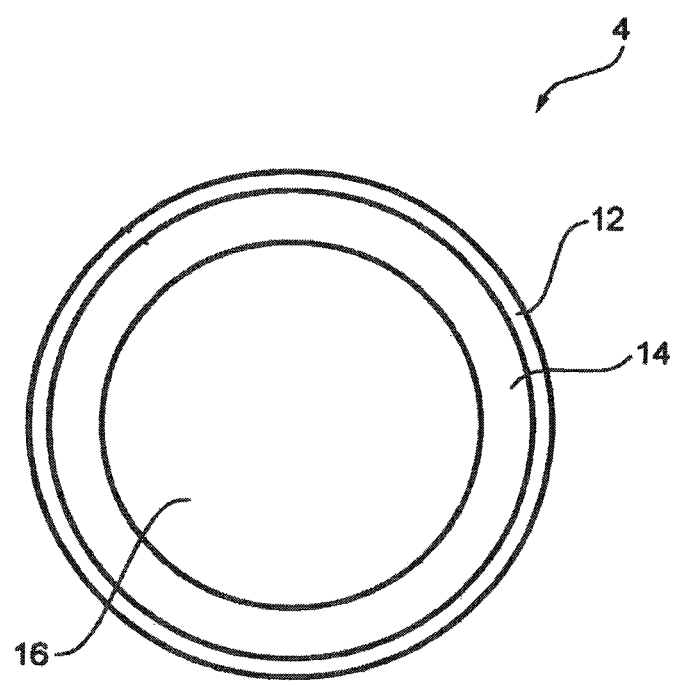
FIG. 4 shows an alternative embodiment of the sensor element in representation according to FIG. 3.

FIG. 4 shows a further embodiment of the sensor element 4 in cross section. The essential difference from the sensor element 4 shown in FIG. 2 and FIG. 3 is in that the sensor element 4 shown in FIG. 4 does not have a core 18. Instead, the carrier body 16 has a solid material, especially of polyethylene.

As intended, the distance sensor 2 detects the approach of a person contactlessly. To this end, an alternating electrical voltage is applied to the sensor element 4 in operation of the distance sensor 2 by the electronics 6, under the action of which voltage an electrical field forms in a space in front of the sensor element 4. Between the sensor element 4 and ground or between the sensor element 4 and any possibly present other sensor element of the distance sensor 2, an electrical capacitor is formed, the electrical capacitance of which is measured by the electronics 6.

In this context, the operation of the distance sensor 2 is based on the physical effect that when human body tissue is introduced into the electrical field, the capacitance that can be measured at the sensor element 6 is increasingly changed with decreasing distance of the body tissue from the sensor element 4.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A capacitive distance sensor comprising:
an elongated sensor element that comprises:
a cylindrical carrier body of an electrically non-conductive material having a circular cross sectional area made of a solid uniform material; and
a single sensor layer circumferentially surrounding the carrier body in the manner of a sheath of an electrically conductive material, wherein the single sensor layer is supplied with an alternating current such that an electrical field forms outside of the sensor layer, wherein an electrical capacitance changes if an object enters the electrical field, and wherein a change in electrical capacitance is detected by the capacitive distance sensor.

2. The capacitive distance sensor according to claim 1, wherein the electrically conductive material of the sensor element is copper or aluminum.

3. The capacitive distance sensor according to claim 1, wherein the electrically non-conductive material of the carrier body is polyethylene.

4. The capacitive distance sensor according to claim 1, wherein the sensor layer is substantially surrounded by an electrically non-conductive insulating layer.

5. The capacitive distance sensor according to claim 1, wherein the sensor layer is formed of a wire mesh.

6. The sensor element according to claim 1, further comprising electronics connected to the sensor element forming a capacitive distance sensor.

7. The use of a sensor element as claimed in claim 1 in a capacitive distance sensor.

8. The capacitive distance sensor according to claim 1, wherein the elongated sensor element terminates at an end, and wherein the end fuses the sensor layer to a connecting line.

9. The capacitive distance sensor according to claim 8, wherein the terminated end is formed of macromelt.

10. The capacitive distance sensor according to claim 1, wherein the capacitive distance sensor detects electrical capacitance.

11. The capacitive distance sensor according to claim 1, wherein the sensor layer is supplied with an alternating current and a capacitive distance is determined relative to a ground state.

12. The capacitive distance sensor according to claim 1, further comprising a plurality of additional elongated sensor elements, each additional elongated sensor elements comprising:
   a cylindrical carrier body of an electrically non-conductive material having a circular cross sectional area made of a solid uniform material; and
   a single sensor layer circumferentially surrounding the carrier body in the manner of a sheath of an electrically conductive material.

13. The capacitive distance sensor according to claim 12, wherein distance is measured by comparing capacitance between sensor elements.

14. The capacitive distance sensor according to claim 1, wherein the electrical capacitance increases with decreasing distance from the user or body tissue.

15. A capacitive distance sensor comprising:
   an elongated sensor element comprising:
   a cylindrical carrier body of an electrically non-conductive material having a round cross sectional area; and
   a single sensor layer circumferentially surrounding the carrier body in the manner of a sheath of an electrically conductive material, wherein the carrier body centrally has an opening which extends perpendicularly to the cross sectional area over an entire length of the cylindrical shape of the carrier body, and wherein the opening is filled with a core formed of an electrically non-conductive material, wherein the single sensor layer is supplied with an alternating current such that an electrical field forms outside of the sensor layer, wherein an electrical capacitance changes if an object enters the electrical field, and wherein a change in electrical capacitance is detected by the capacitive distance sensor for contactlessly detecting a distance of the object from the sensor element.

16. The capacitive distance sensor according to claim 15, wherein the sensor layer is substantially surrounded by an electrically non-conductive insulating layer.

17. The capacitive distance sensor according to claim 15, wherein the elongated sensor element terminates at an end, and wherein the end fuses the sensor layer to a connecting line.

18. The capacitive distance sensor according to claim 15, wherein the electrically non-conductive material is solid.

* * * * *